(12) United States Patent
Kitade

(10) Patent No.: US 6,225,836 B1
(45) Date of Patent: May 1, 2001

(54) SEMICONDUCTOR INTEGRATED CIRCUIT DEVICE CAPABLE OF ALTERING AN OPERATING MODE BY AN ELECTRICAL INPUT APPLIED FROM OUTSIDE PRODUCT PACKAGE

(75) Inventor: Osamu Kitade, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/336,710

(22) Filed: Jun. 21, 1999

(30) Foreign Application Priority Data

Jan. 19, 1999 (JP) .................................................. 11-010234

(51) Int. Cl.$^7$ .................................................. H03K 5/153
(52) U.S. Cl. ............................................. 327/80; 365/200
(58) Field of Search ................................ 365/200; 327/80

(56) References Cited

U.S. PATENT DOCUMENTS 5,666,314 * 9/1997 Akaogi et al. ........................ 365/200

* cited by examiner

Primary Examiner—David Nelms
Assistant Examiner—M. Tran
(74) Attorney, Agent, or Firm—McDermott, Will & Emery

(57) ABSTRACT

A semiconductor integrated circuit device includes an operating mode setting circuit for determining an operating mode. Operating mode setting circuit includes an operating mode control circuit and an operating mode alteration circuit. Operating mode control circuit generates an operating mode setting signal depending on wire bonding provided to external input pads. Operating mode alteration circuit includes fuse input pads, electric fuses, and an operating mode inverting circuit. Operating mode inverting circuit inverts an operating mode setting signal once determined by blowing each of electric fuses.

9 Claims, 15 Drawing Sheets

SEMICONDUCTOR INTEGRATED CIRCUIT DEVICE CAPABLE OF ALTERING AN OPERATING MODE BY AN ELECTRICAL INPUT APPLIED FROM OUTSIDE PRODUCT PACKAGE

BACKGROUND OF THE INVENTION

1. Field of the Invention

The present invention relates to a semiconductor integrated circuit device, and more particularly to a semiconductor integrated circuit device having a function to alter the operating mode.

2. Description of the Background Art

At present, in general, in semiconductor integrated circuit devices produced, an operating mode is set in which one of two alternatives is selected where the representative examples of such selection include the selection between +5V and +3.3V for the operating power supply voltage, and the selection between the Fast Page mode (hereinafter referred to as the FP mode) and the Hyper Page mode (or the Extend Data Output mode, hereinafter referred to as the EDO mode).

When shipped, a semiconductor integrated circuit device has one of the two alternatives of an operating mode set according to the product specifications. It is desirable, however, to allow alteration of the operating mode with flexibility according to the state of production or the trend of market demands.

As an example of a technique that allows the switching of the operating mode of a semiconductor integrated circuit device according to changes in the state of production or the trend of market demands, a mode switching circuit is disclosed in the Japanese Patent Laying-Open No. 4-199541.

FIG. 17 is a circuit diagram of a prior art mode switching circuit 500.

As shown in FIG. 17, a mode switching circuit 500 includes an external input terminal 201 to which a voltage is applied externally for switching the mode, an external input pad 202 connected to external input terminal 201, a node 220 for outputting a control signal to switch the mode, a power supply line 204 for supplying a power supply voltage Vcc, a ground line 205 for supplying a ground potential Vss, an electric fuse 210 and resistive element 206 connected in series between power supply line 204 and node 220, and a resistive element 207 connected between ground line 205 and node 220.

Mode switching circuit 500 further includes an N-channel MOS transistor 203 having a gate connected to node 220 for connecting external input pad 202 with node 220.

In mode switching circuit 500, normally the resistance value ratio of resistive element 206 to resistive element 207 is determined such that the potential of node 220 is at the logic high or "H" level (Vcc). Here, N-channel MOS transistor 203 is designed to have a threshold voltage which allows the off state to be maintained even when external input terminal 201 is at the Vss level. Thus, under normal circumstances, external input terminal 201 and external input pad 202 are disconnected from node 220.

When switching the mode, a potential having a sufficient potential difference from the Vcc level is applied to external input terminal 201 to blow electric fuse 210. By blowing electric fuse 210, the potential of node 220 can be made to attain the logic low or "L" level (Vss) by resistive element 207, and thus the mode is switched.

Mode switching circuit 500 allows switching of the mode by having a voltage applied from outside to the memory device and having the electric fuse blown after the completion of the manufacturing process.

Thus, in a semiconductor integrated circuit device having a prior art mode switching circuit 500, it is possible to switch the mode by an operation performed from outside even after the manufacturing process is completed.

While the prior art mode switching circuit 500 allows switching of the operating mode after the completion of the manufacturing process, since an additional step of fuse blowing is required for the switching of the operating mode, alteration at a later time of an operating mode once determined at the stage of circuit design prior to the start of the manufacturing process may affect productivity, when, for instance, a great number of products must be subjected to such an alteration.

In addition, in the prior art mode switching circuit 500, since an electric fuse is blown by a current that flows through an MOS transistor and since the potential applied from outside to blow the fuse is also supplied to a node for generating a control signal, the internal circuit may be adversely affected, a successful fuse blow may not be ensured, and problems regarding performance reliability may arise.

Further, as to the above-mentioned MOS transistor, an MOS transistor having different characteristics from those of the other transistors in the semiconductor integrated circuit may be required to maintain the off state under normal conditions and to allow the passage of the fuse blow current when switching the mode. In such a case, the degree of freedom in layout designs could be limited.

SUMMARY OF THE INVENTION

One object of the present invention is to provide a semiconductor integrated circuit device which allows setting of the operating mode with certainty and flexibility by an external electrical input even after the device is encapsulated in a product package.

In brief, the present invention provides a semiconductor integrated circuit device including an internal circuit and an operating condition setting circuit, wherein the internal circuit operates according to either one of the two operating conditions according to an operating condition setting signal, the operating condition setting circuit generates an operating condition setting signal, and the operating condition setting circuit includes a first external input terminal, an internal control signal generating circuit for generating an operating condition setting signal that selects either one of the two operating conditions depending on whether the first external input terminal is coupled to a prescribed potential, and an operating condition alteration circuit which allows the alteration of the operating condition to be set selectively and in a non-volatile manner, independent of the potential level of the first external input terminal by an electrical signal provided externally.

According to another aspect of the present invention, the present invention provides a semiconductor integrated circuit device including an internal circuit and an operating condition setting circuit, wherein the internal circuit operates according to either one of the two operating conditions according to an operating condition setting signal, the internal circuit includes a memory cell array having a plurality of memory cells arranged in a matrix of rows and columns, an address signal terminal for receiving a plurality of address signals for selecting the row and the column of the memory cells, and a control signal terminal for receiving a plurality of control signals for controlling the operation of the semiconductor integrated circuit device, the operating condition setting circuit generates an operating condition setting signal, and the operating condition setting circuit includes an external input terminal, an internal control signal generating circuit for generating an operating condition setting signal that selects one of the two operating conditions depending on whether the external input terminal is coupled to a prescribed potential, and a test operating condition setting circuit selectively allowing the alteration of the operating condition to be set, independent of the potential level of the external input terminal, by the combination of a plurality of control signals and a plurality of address signals provided externally.

Thus, the principal advantage of the present invention is the improved freedom with which an operating mode of the semiconductor integrated circuit device is set and the increased certainty with which a fuse is blown, owing to the fact that the operating mode, once selected depending on the presence/absence of coupling between an external input terminal and a prescribed potential, can be altered by blowing a fuse element provided independent of the circuit for generating the operating condition setting signal.

Furthermore, circuit evaluation and analysis can be done without restrictions according to the combination of a control signal and an address signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
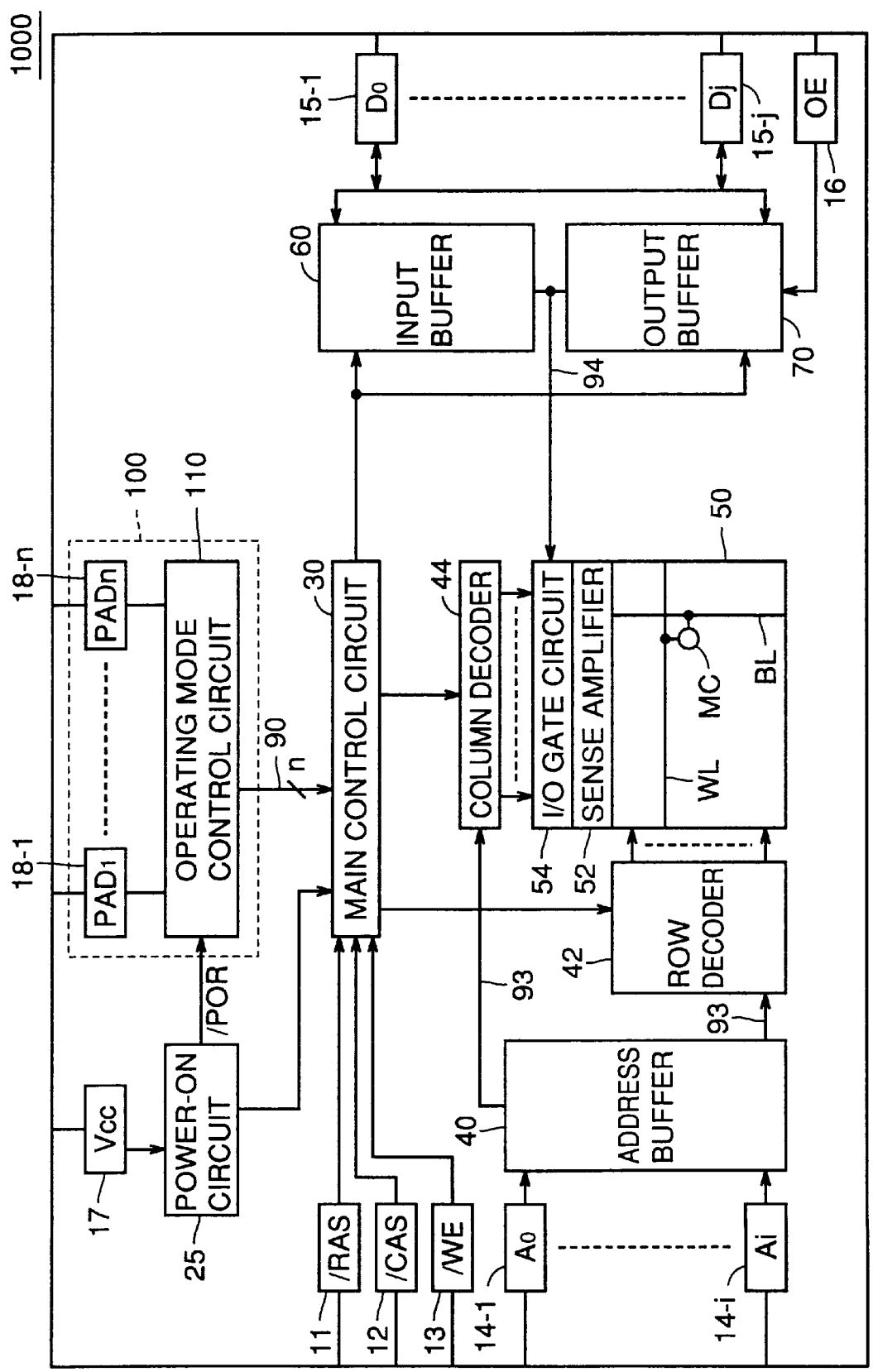
FIG. 1 is a schematic block diagram representing an overall configuration of a semiconductor integrated circuit device 1000 relating to a semiconductor integrated circuit device according to the first embodiment of the present invention.

The embodiments of the present invention will be described below in detail with reference to the drawings. Throughout the drawings, the same reference characters are used to designate the same or similar parts.

First Embodiment

[Setting of Operational Mode by Wire Bonding]

FIG. 1 is a schematic block diagram representing an overall configuration of a semiconductor integrated circuit device 1000 in which an operating mode is set by wire bonding and relating to a semiconductor integrated circuit device according to the first embodiment of the present invention.

In FIG. 1, a semiconductor integrated circuit device 1000 is provided with input/output pads 11–17 for receiving control signals, input/output data, operating power supply voltage, and the like. Input/output pads 11–17 respectively receive a row address strobe signal /RAS, a column address strobe signal /CAS, a write enable signal /WE, address signals A0–Ai (i: a natural number), input/output data D0–Dj (j: a natural number), an output enable signal OE, and an operating power supply voltage Vcc.

Row address strobe signal /RAS starts the internal operation of semiconductor integrated circuit device 1000 and activates the circuit relating to the operation of selecting a row in memory cell array 50. Column address strobe signal /CAS activates the circuit relating to the operation of selecting a column in memory cell array 50. Write enable signal/ WE instructs to perform the write operation to semiconductor integrated circuit device 1000. Output enable signal OE instructs to perform the read operation from semiconductor integrated circuit device 1000.

Semiconductor integrated circuit device 1000 further includes a power-on circuit 25 for generating a power-on-reset signal /POR, a main control circuit 30 for receiving control signals to control the operations of the entire semiconductor integrated circuit device, an address buffer 40 for receiving address signals A0–Ai to generate an internal address signal, and a memory cell array 50 having a plurality of memory cells MC arranged in a matrix of rows and columns. Though not shown, a memory cell MC is formed from a capacitor for holding data, and an access transistor having a gate connected to a word line corresponding to each row of a memory cell.

In memory cell array 50, a word line WL is used for each row of a memory cell, and a bit line BL is provided for each column of a memory cell. A row and a column of a memory cell is selected by a row decoder 42 and a column decoder 44 according to the internal address signal transmitted by an address signal line 93 from address buffer 40.

According to the output from row decoder 42, a word line WL corresponding to an address signal is selectively activated, and the data read out on a bit line BL by the activation of word line WL is amplified by a sense amplifier 52.

According to the output from column decoder 44, an I/O gate circuit 54 is controlled, and data transmission and reception occurs between a memory cell MC and an input buffer 60 or an output buffer 70 via sense amplifier 52 and a data bus 94.

Input buffer 60 and output buffer 70 are provided as buffering circuits for the input/output data handled by input/output pads 15-1 to 15-j.

Semiconductor integrated circuit 1000 further includes a mode setting circuit 100. Mode setting circuit 100 includes external input pads PAD1–PADn (n: a natural number) for receiving electrical signals from outside, and an operating mode control circuit 110. Operating mode control circuit 110 outputs an operating mode setting signal according to inputs to external input pads PAD1–PADn and a power-on-reset signal /POR generated by the power-on circuit.

Power-on-reset signal /POR rises from the inactive state ("L" level) to the active state ("H" level) at power-on, and is kept active while the power is on.

The operating mode setting signal is transmitted to main control circuit 30 via an operating mode setting signal line 90, and the entire semiconductor integrated circuit device operates according to the operating mode setting signal.

In semiconductor integrated circuit device 1000, a signal for finalizing the operating mode setting is provided to external input pads PAD1–PADn by wire bonding in an assembling step, which is the final step in the manufacturing process of the semiconductor integrated circuit device, to allow operating mode control circuit 110 to determine the operating mode according to the inputs to the external input pads.

In this manner, freedom in determining the operating mode is ensured, since an operating mode can be selected for semiconductor integrated circuit devices produced based on the same design specifications in the final stage of the manufacturing process without an additional processing step.

Figure 2:
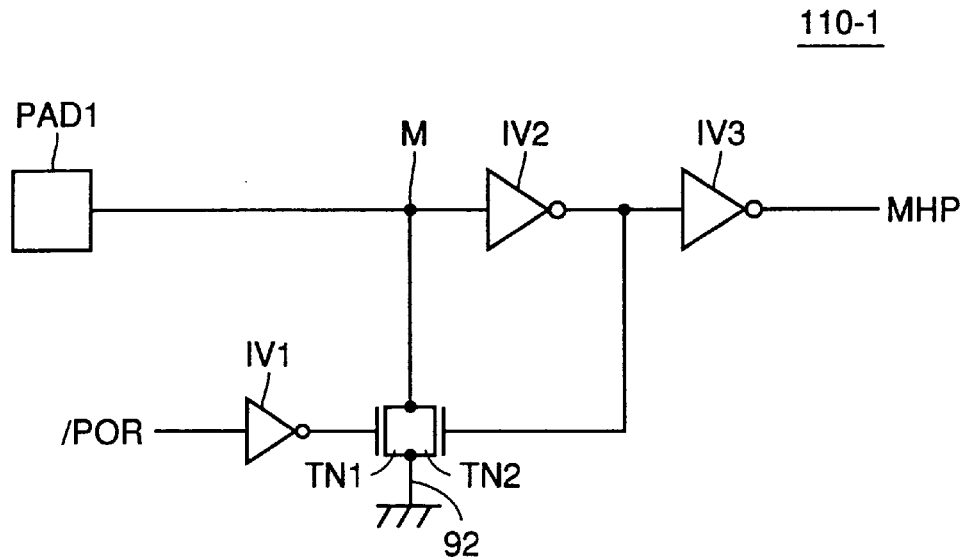
FIG. 2 is a circuit diagram representing a configuration of an operating mode control circuit 110-1.

FIG. 2 is a circuit diagram representing a configuration of an operating mode control circuit 110 in semiconductor integrated circuit device 1000. FIG. 2 shows an operating mode control circuit 110-1 which corresponds to an external input pad PAD1.

Operating mode control circuit 110-1 outputs an operating mode setting signal MHP for determining the page mode setting as either the FP mode or the EDO mode according to the setting of external input pad PAD1. When setting the page mode, the "H" level of operating mode setting signal MHP corresponds to the EDO mode, while the "L" level corresponds to the FP mode.

Thus, when the EDO mode is to be set, wire bonding is provided to connect external input pad PAD1 with a line for supplying the power supply voltage Vcc, whereas when the FP mode is to be set, no wire bonding is provided for external input pad PAD1 (i.e. external input pad PAD1 is in a floating state).

Operating mode control circuit 110-1 includes an intermediate node M, N-channel transistors TN1 and TN2 connected between intermediate node M and a ground line 92, an inverter IV1 for inverting a power-on-reset signal/POR and providing the inverted signal to the gate of transistor TN1, an inverter IV2 for inverting the state of intermediate node M, and an inverter IV3 for further inverting the output of inverter IV2 to output a signal MHP. The output of inverter IV2 is provided to the gate of transistor TN2.

Figure 3:
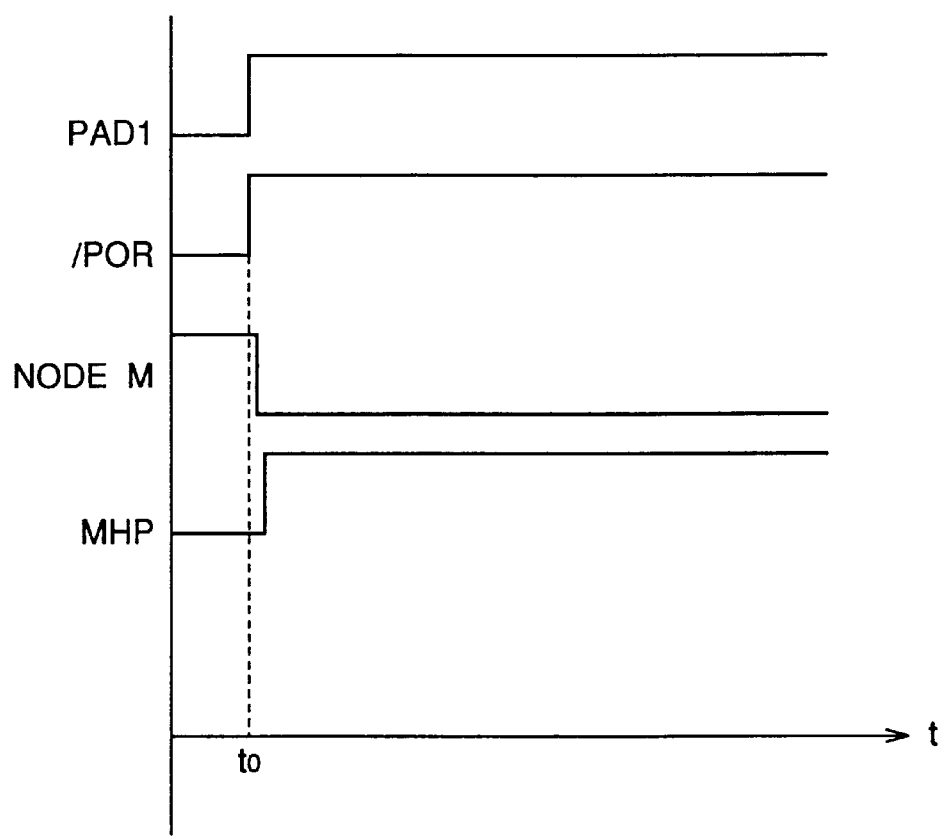
FIG. 3 is a timing chart showing an operational waveform for each portion of operating mode control circuit 110-1.

Next, the operation of operating mode control circuit 110-1 will be described based on an operational waveform of each signal. FIG. 3 is a timing chart showing an operational waveform for each portion of operating mode control circuit 110-1.

As seen from FIG. 3, since power-on-reset signal /POR is inactive ("L" level) before power-on time t0, the output of inverter IV1 attains the "H" level and transistor TN1 is turned on. As a result, the potential of intermediate node M attains the "L" level, transistor TN2 is turned on by the output of inverter IV2, and signal MHP attains the "L" level.

When power is turned on at time t0, the potential of external input pad PAD1 rises to the Vcc level ("H" level) and power-on-reset signal /POR also is activated ("H" level). Accordingly, transistor TN1 is turned off, and the potential of intermediate node M similarly attains the Vcc level. Thus, the output of inverter IV2 attains the "L" level, and transistor TN2 is turned off, while the output of inverter IV3, or signal MHP, attains the "H" level. The transmission of signal MHP to main control circuit 30 causes semiconductor integrated circuit device 1000 to operate in the EDO mode.

On the other hand, if wire bonding is not provided for external input pad PAD1 or if the FP mode is set, intermediate node is maintained at the "L" level by transistor TN2 even after the activation of signal /POR, and signal MHP also attains the "L" level. Consequently, semiconductor integrated circuit device 1000 operates in the FP mode.

By utilizing such a configuration as described above, in semiconductor integrated circuit device 1000, circuits having the same design can be used and the operating mode can be determined by providing wire bonding in the final stage of the manufacturing process.

As a result, the same degree of freedom as that allowed in the prior art example is ensured without the need for an additional processing step and thus without affecting productivity.

In addition, since the state of intermediate node is set by transistors TN1 and TN2 and power-on-reset signal /POR, by positively avoiding the situations in which the state of the operating mode setting signal is indefinite even when the external input pad is in a floating state, a successful setting of an operating mode can be achieved and the reliability of the entire semiconductor integrated circuit device is improved.

Figure 4:
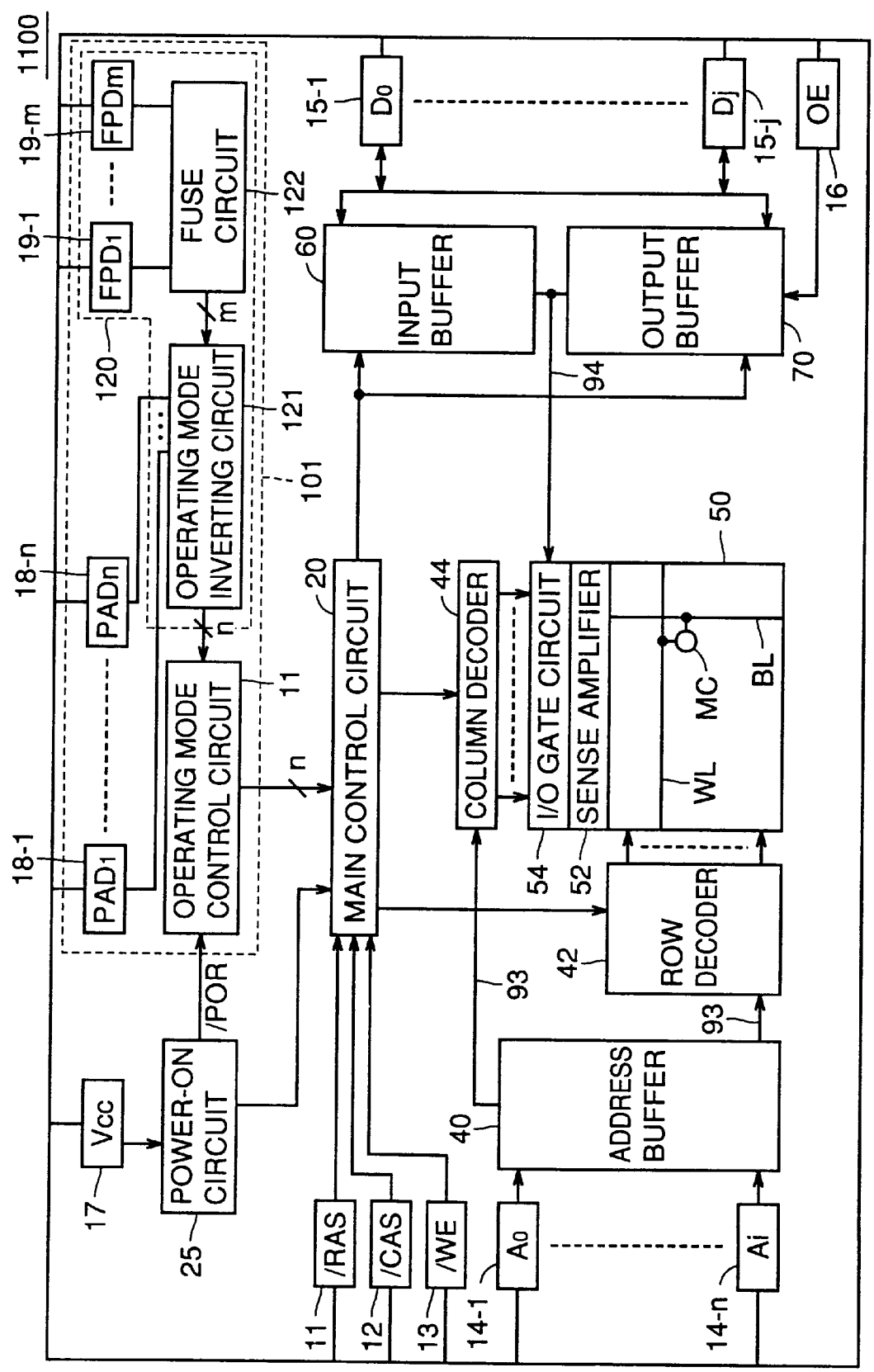
FIG. 4 is a schematic block diagram representing an overall configuration of a semiconductor integrated circuit device 1100 according to the first embodiment of the present invention.

Next, a semiconductor integrated circuit device 1100 according to the first embodiment of the present invention will be described. FIG. 4 is a schematic block diagram representing an overall configuration of a semiconductor integrated circuit device 1100 according to the first embodiment.

Although in semiconductor integrated circuit device 1000 the operating mode is set by selecting whether or not to provide wire bonding to an external input pad in the assembling step which is the final step in the manufacturing process, semiconductor integrated circuit device 1100, on top of the advantages gained from of the semiconductor integrated circuit device 1000, aims at enabling alteration of an operating mode in a product after the completion of the manufacturing process, i.e. after it has been mold-sealed, by blowing a fuse electrically using a voltage provided from outside via an input/output pin.

As seen in FIG. 4, the difference between semiconductor integrated circuit device 1100 and semiconductor integrated circuit device 1000 of FIG. 1 is the configuration of mode setting circuit 101.

Specifically, in comparison with mode setting circuit 100, mode setting circuit 101 is provided with an operating mode alteration circuit 120 including a fuse for altering the operating mode determined at one time depending on whether or not wire bonding is provided to an external input pad.

Operating mode alteration circuit 120 includes a fuse circuit 122, fuse input pads FPD1–FPDm (m: a natural number) for blowing a fuse element in the fuse circuit after the completion of the manufacturing process, and an operating mode inverting circuit 121 for inverting an operating mode signal when the fuse element is blown.

Figure 5A:
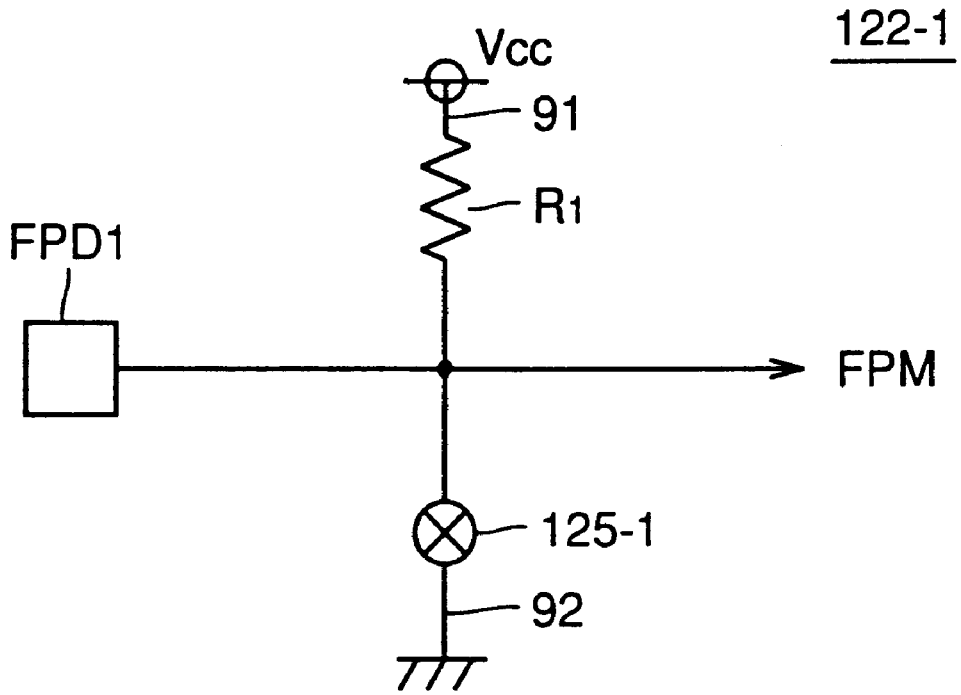
FIG. 5A is a circuit diagram representing a configuration of a fuse circuit 122-1.
Figure 5B:
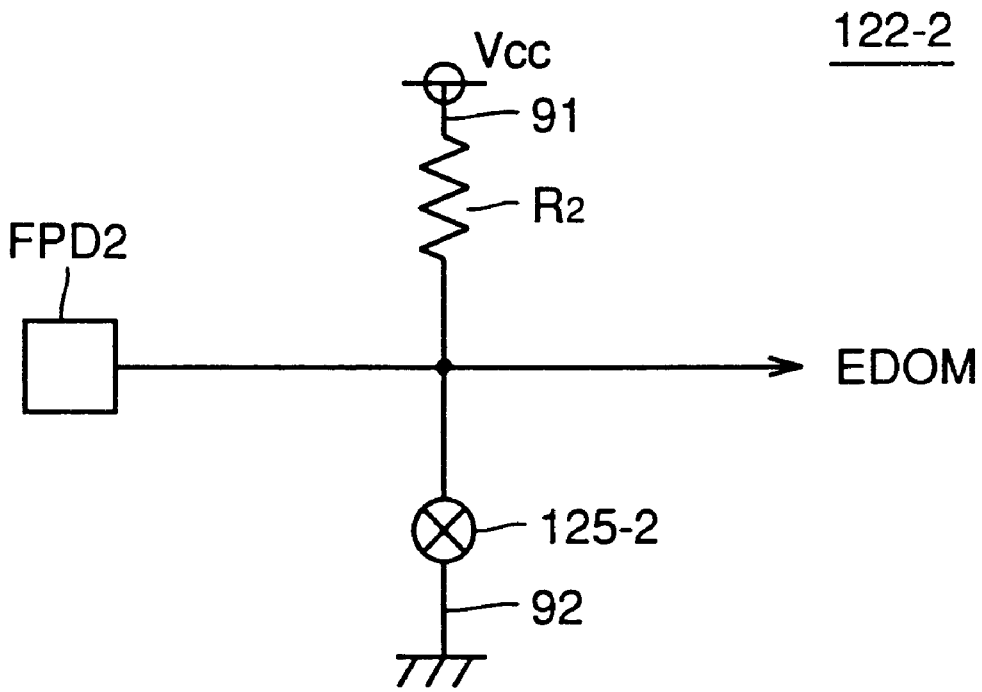
FIG. 5B is a circuit diagram representing a configuration of a fuse circuit 122-2.

FIG. 5A represents a configuration of a fuse circuit 122-1 corresponding to a fuse input pad FPD1. FIG. 5B is a circuit diagram representing a configuration of a fuse circuit 122-2 corresponding to a fuse input pad FPD2.

As seen from FIG. 5A, fuse circuit 122-1 outputs a mode alteration signal FPM for altering the operation mode from the EDO mode determined by wire bonding to the FP mode when an electric fuse 125-1 is blown. Signal FPM is normally set at the Vss level ("L" level). When electric fuse 125-1 is blown by the application of a high voltage to fuse input pad FPD1, signal FPM attains the Vcc level ("H" level).

Similarly, as seen from FIG. 5B, fuse circuit 122-2 outputs a mode alteration signal EDOM for altering the operating mode from the FP mode to the EDO mode when electric fuse 125-2 is blown. Signal EDOM also is normally at the Vss level ("L" level) and attains the Vcc level ("H" level) when electric fuse 125-2 is blown by the application of a high voltage to fuse input pad FPD2.

Mode alteration signal FPM and signal EDOM are transmitted to operating mode inverting circuit 121.

Figure 6:
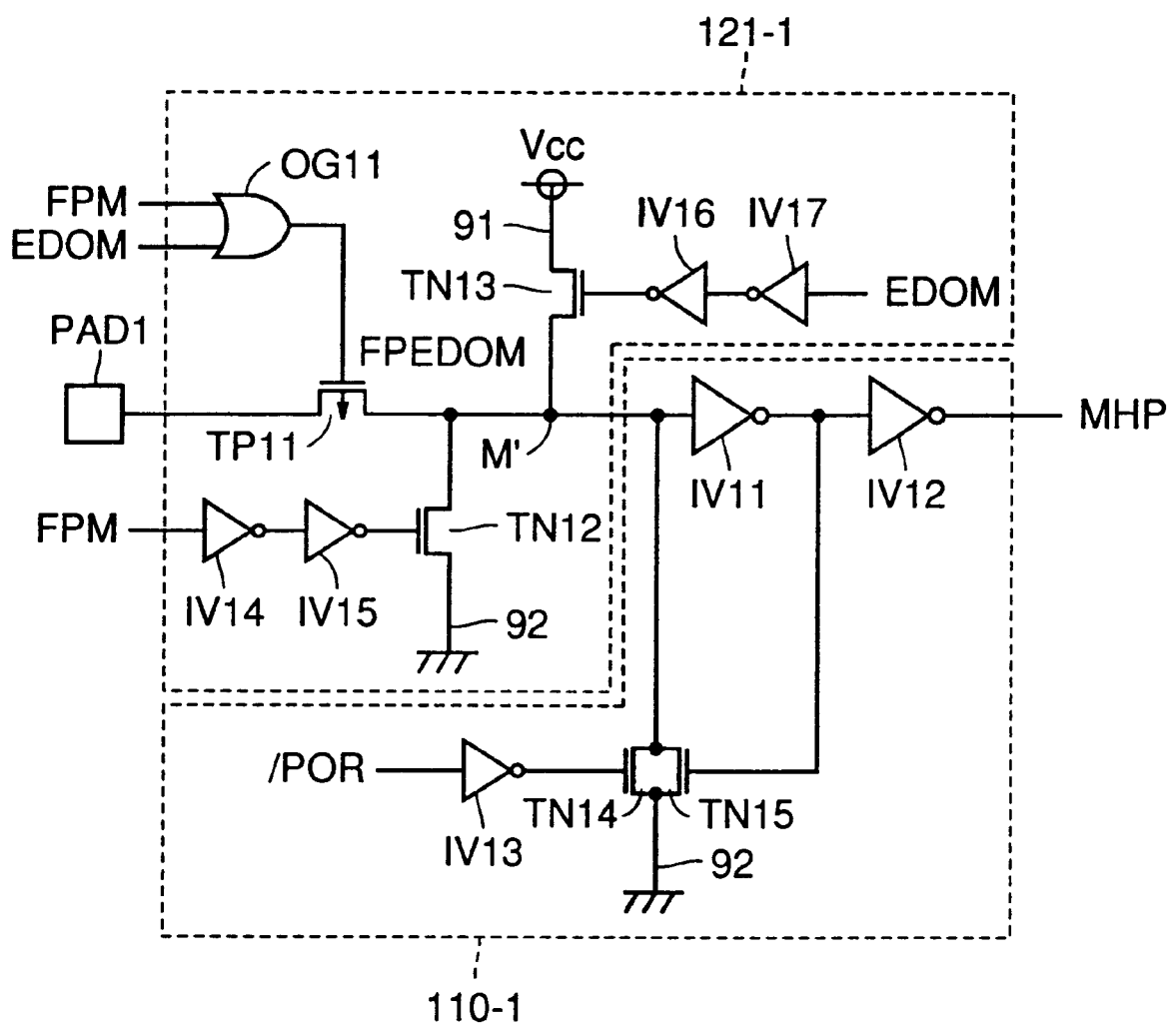
FIG. 6 is a circuit diagram representing a configuration of an operating mode inverting circuit 121-1.

FIG. 6 is a circuit diagram representing a configuration of an operating mode inverting circuit 121-1 corresponding to operating mode control circuit 110-1 in semiconductor integrated circuit device 1000.

Operating mode control circuit 110-1 generates signal MHP for determining the setting of the page mode among the operating modes. Signal MHP is determined by the states of signals FPM and EDOM and the input pad PAD1. The relation between signal MHP and an operating mode is as described with reference to FIG. 2.

As seen from FIG. 6, wire bonding is provided between input pad PAD1 and the Vcc power supply line when the page mode is set to the EDO mode as in FIG. 2.

Operating mode inverting circuit 121-1 is connected between input pad PAD1 and operating mode control circuit 110-1. Operating mode inverting circuit 121-1 and operating mode control circuit 110-1 share an intermediate node M'.

Operating mode inverting circuit 121-1 includes a transistor TP11 connected between input pad PAD1 and intermediate node M', an N-channel transistor TN12 connected between intermediate node M' and ground line 92, an N-channel transistor TN13 connected between intermediate node M' and power supply line 91, inverters IV14 and IV15 for providing, after a delay, signal FPM to the gate of transistor TN12, and inverters IV16 and IV17 for similarly providing, after a delay, signal EDOM to the gate of transistor TN13.

Operating mode inverting circuit 121-1 further includes a logic gate OG11 for performing an OR operation using signals FPM and EDOM to output a signal FPEDOM. The output FPEDOM of logic gate OG11 is provided to the gate of transistor TP11. Signal FPEDOM changes from the "L" level to the "H" level when an electric fuse in at least one of the fuse circuits 122-1 and 122-2 is blown.

Operating mode control circuit 110-1 further includes an inverter IV11 for inverting an output of intermediate node M', an inverter IV12 for inverting an output of inverter IV11 to output a signal MHP, an inverter IV13 for inverting a power-on-reset signal /POR and providing the inverted signal to the gate of transistor TN14, and N-channel transistors TN14 and TN15 connected between intermediate node M' and ground line 92.

Inverter IV13 and transistor TN14 serve to fix the levels of signal MHP and intermediate node M' to the "L" level before power-on, as described above.

In operating mode control circuit 110-1, when neither of the electric fuses 125-1 and 125-2 is blown, transistor TP11 is turned on and inverters IV11 and IV12 make the state of signal MHP equal to the state of input pad PAD1.

On the other hand, if the electric fuse is blown in either of fuse circuits 122-1 and 122-2, signal FPEDOM attains the "H" level and operating mode inverting circuit 121-1 accordingly disconnects input pad PAD1 from intermediate node M'.

Moreover, operating mode inverting circuit 121-1 determines the potential of intermediate node M' by conducting transistor TN12 or TN13 according to the states of signals FPM and EDOM which are output signals from fuse circuit 122. Then, the potential of signal MHP is determined accordingly.

As described above, by separately providing the circuit for setting the operating mode and the circuit for blowing an electric fuse, the electric fuse can be blown using a current path which does not involve a MOS transistor. At the same time, since the fuse blow current is never directly applied to the circuit for setting the operating mode, a fuse is blown more successfully, and negative influences to the internal circuit is eliminated, leading to an improved performance reliability over the prior art example.

Figure 7:
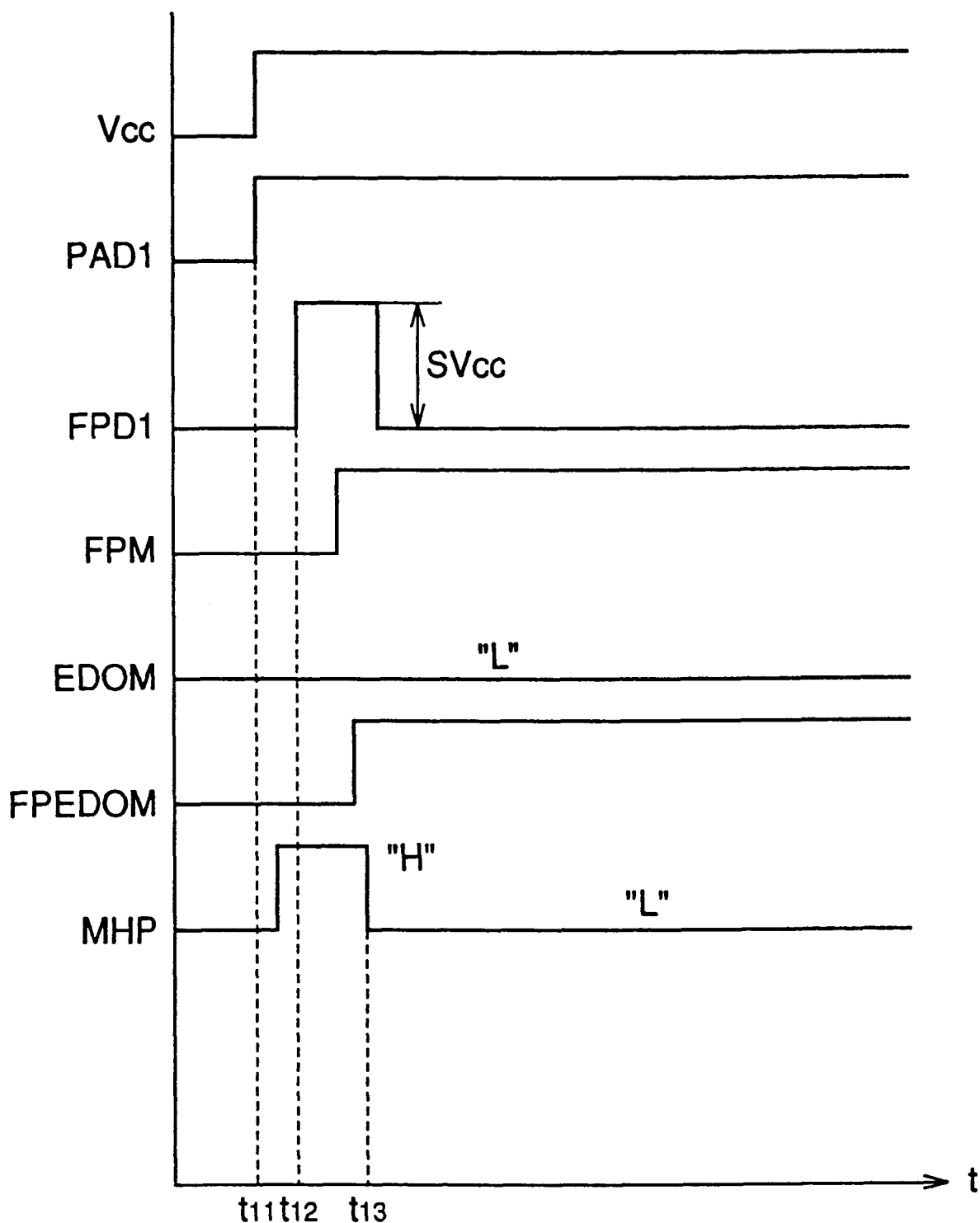
FIG. 7 is a timing chart showing an operational waveform for each portion when the page mode setting is switched from the EDO mode to the FP mode in semiconductor integrated circuit device 1100.

Next, the actual operations of operating mode inverting circuit 121 and operating mode control circuit 110 will be described in relation to the waveforms of the operating signals for each portion. FIG. 7 is a timing chart relating to the operation when the page mode setting is switched from the EDO mode to the FP mode in semiconductor integrated circuit device 1100 according to the first embodiment.

In FIG. 7, the operating power supply is turned on at time t11, and the potential of the Vcc pad rises to the Vcc level. Since the EDO mode is selected for the page mode, wire bonding is provided to input pad PAD1, and thus the potential of input pad PAD1 also rises to the Vcc level ("H" level). Signal MHP is fixed at the "L" level before power-on of the operating power supply voltage through an operation similar to the one described above.

At this time, the electric fuse is not yet blown so that both the signals FPM and EDOM are at the "L" level, and signal FPEDOM also attains the "L" level. Thus, transistor TP1 is on so that the potential of intermediate node M' attains the "H" level corresponding to the potential of input pad PAD1 while signal MHP also attains the "H" level, causing the page mode to be set to the EDO mode.

Then, at time t12, a potential SVcc sufficient to blow an electric fuse 125-1 is applied in a pulse-wise manner in order to alter the operating mode. Accordingly, electric fuse 125-1 is blown, signal FPM rises to the "H" level, and signal FPEDOM also changes to the "H" level.

With the changes of signals FPM and FPEDOM, transistor TN12 changes from its off state to the on state, while transistor TP11 changes from its on state to the off state. Consequently, the potential of intermediate node M' attains the "L" level, and output signal MHP changes from the "H" level to the "L" level.

As seen from above, by blowing the electric fuse with a high voltage application to the fuse input pad, the operating mode can be altered to the FP mode even when it was originally set to the EDO mode by wire bonding.

Next, the operation will be described in which the page mode, originally set to the FP mode, is altered to the EDO mode after the completion of the manufacturing process.

Figure 8:
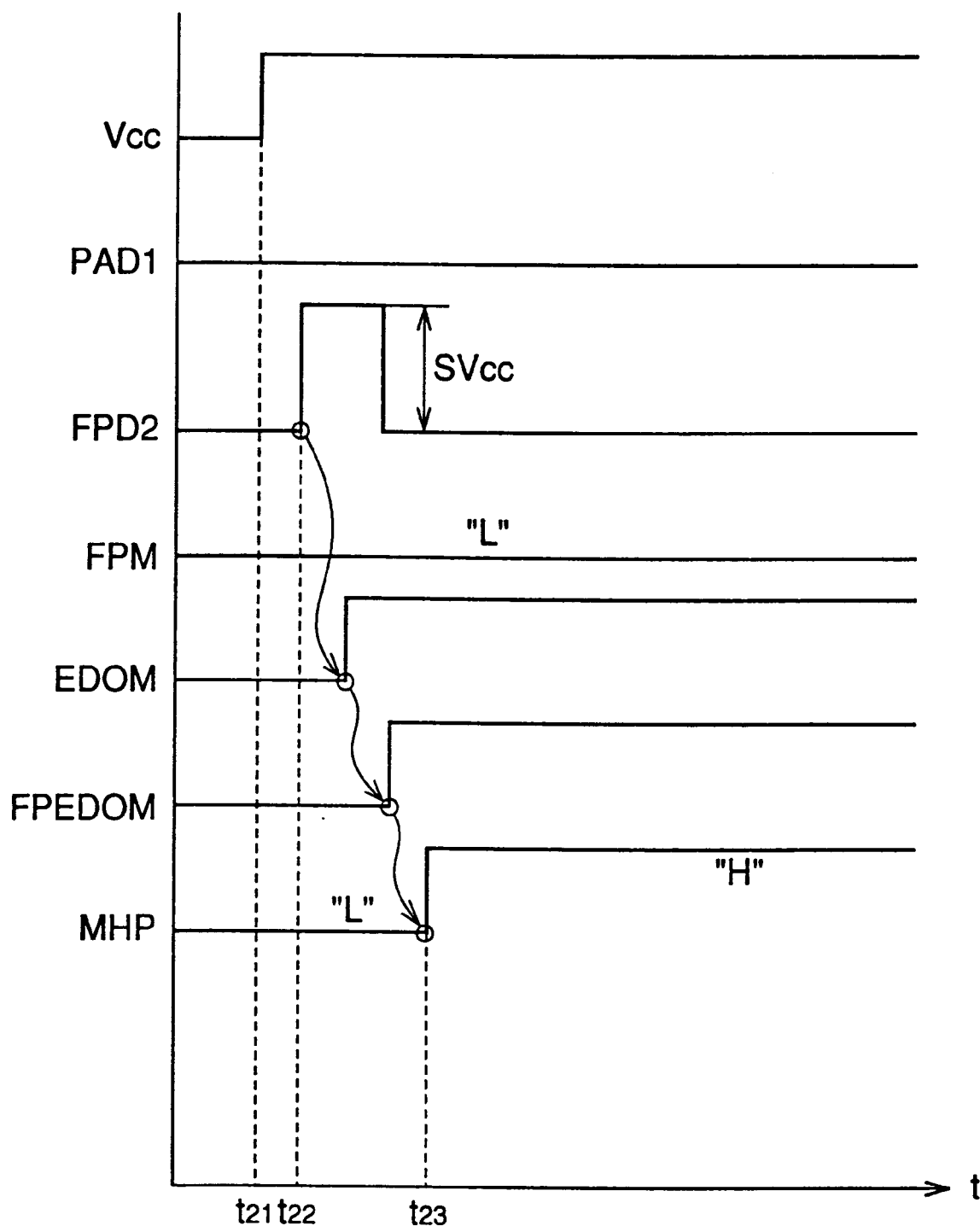
FIG. 8 is a timing chart showing an operational waveform for each portion when the page mode setting is switched from the FP mode to the EDO mode in semiconductor integrated circuit device 1100.

FIG. 8 is a timing chart showing an operational waveform for each portion when the page mode setting is switched from the FP mode to the EDO mode in semiconductor integrated circuit device 1100.

As seen in FIG. 8, first, at time t21, the operating power supply is turned on and the potential of the Vcc pad rises to the Vcc level. Since the electric fuse is not blown at this time, signal FPEDOM is at the "L" level and transistor TP11 is on.

The FP mode is selected for the page mode so that input pad PAD1 is in a floating state. Since the potential of input pad PAD1 does not rise to the Vcc level ("H" level), the potential of intermediate node M' connected to input pad PAD1 by transistor TP1 does not attain the "H" level. The output of inverter IV11 stays at the "H" level so that the on state of the transistor TN15 is maintained and the state of signal MHP maintains the "L" level as from before the operating power supply is turned on, thereby causing the page mode to be set to the FP mode.

Then, at time t22, a high pulsed voltage SVcc is applied to fuse input pad FPD2 to blow electric fuse 125-2 in fuse circuit 122-2. When electric fuse 125-2 is blown, signals EDOM and FPEDOM change to the "H" level.

The turning-off of transistor TP11 and the turning-on of transistor TN13 according to the changes in signals FPM and FPEDOM cause signal MHP to be set at the "H" level. Consequently, the potential of intermediate node M' attains the "H" level, and output signal MHP changes from the "L" level to the "H" level.

As described above, by blowing the electric fuse with the application of a high voltage to the fuse input pad, the operating mode, originally set to the FP mode by wire bonding, can be altered to the EDO mode by the subsequent fuse blow.

[Alteration of Operating Mode of Operating Power Supply Voltage]

Next, as another example of an alteration of an operating mode in semiconductor integrated circuit device 1100, the alteration of the operating power supply voltage setting will be described.

Figure 9:
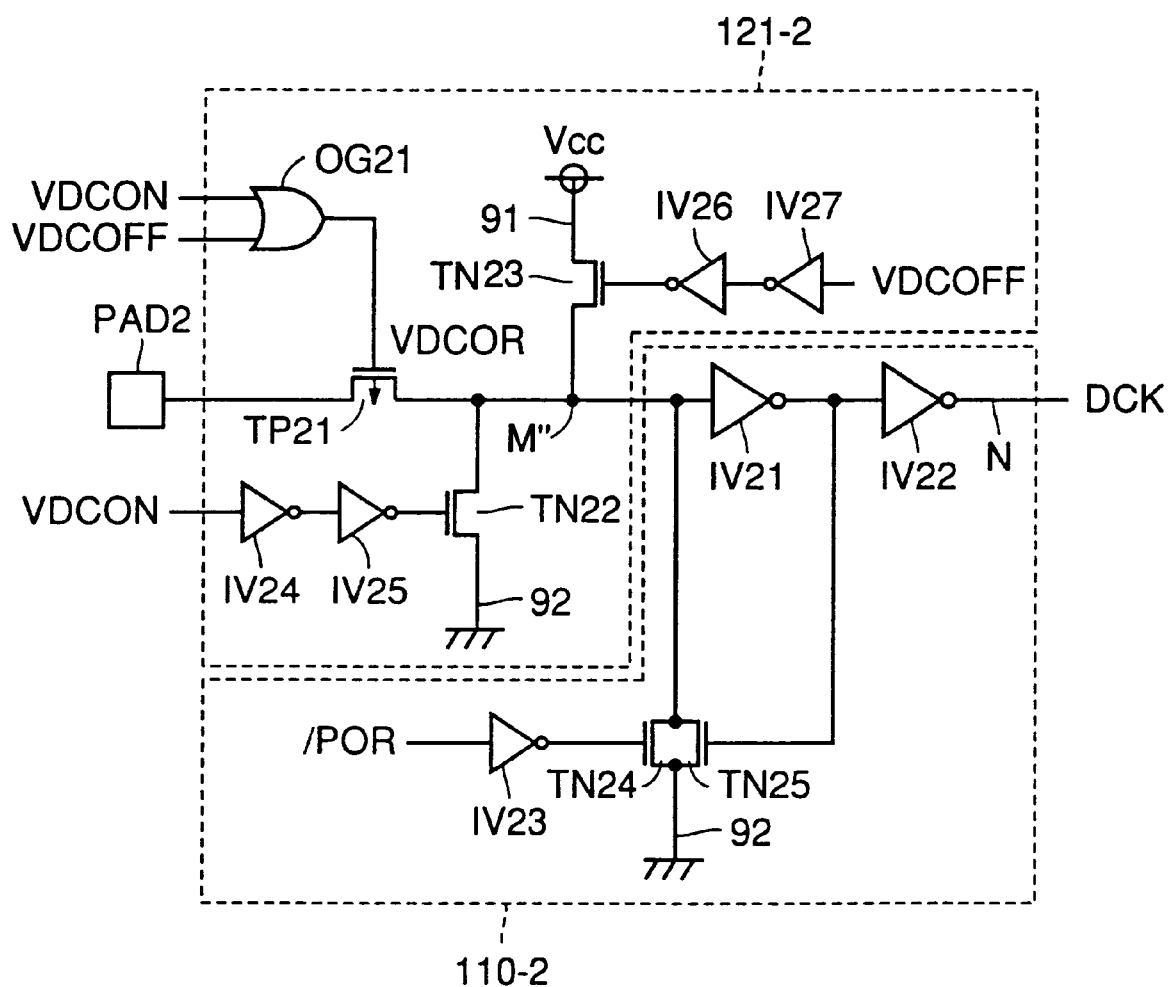
FIG. 9 is a circuit diagram representing the configurations of operating mode inverting circuit 121-2 and an operating mode control circuit 110-2.

FIG. 9 is a circuit diagram representing the configurations of operating mode control circuit 110-2 and operating mode inverting circuit 121-2 in semiconductor integrated circuit device 1000. Operating mode control circuit 110-2 generates a signal DCK for setting, among the operating modes, the operating power supply voltage to either +5V or +3.3V. In the setting of the operating power supply voltage, the "H" level of operating mode setting signal DCK corresponds to +3.3V, while the "L" level corresponds to +5V. When the operating power supply voltage is to be set at +3.3V, wire bonding is provided to connect external input pad PAD2 with a line supplying the power supply voltage Vcc, whereas when the operating power supply voltage is to be set at +5V, no wire bonding is provided for external input pad PAD2 so that the external input pad PAD2 is in a floating state.

As seen in FIG. 9, operating mode control circuit 110-2 generates signal DCK according to the states of mode alteration signals VDCON and VDCOFF and input pad PAD2. The manner of connection of internal input pads, transistors, inverters, and the like in operating mode control circuit 110-2 and operating mode inverting circuit 121-2 are similar to those in operating mode control circuit 110-1 and operating mode inverting circuit 121-1 except for the signal provided for each portion.

Specifically, signal MHP in operating mode control circuit 110-1 corresponds to signal DCK, and similarly, signals FPM, EDOM, and FPEDOM correspond respectively to signals VDCON, VDCOFF, and VDCOR.

Figure 10A:
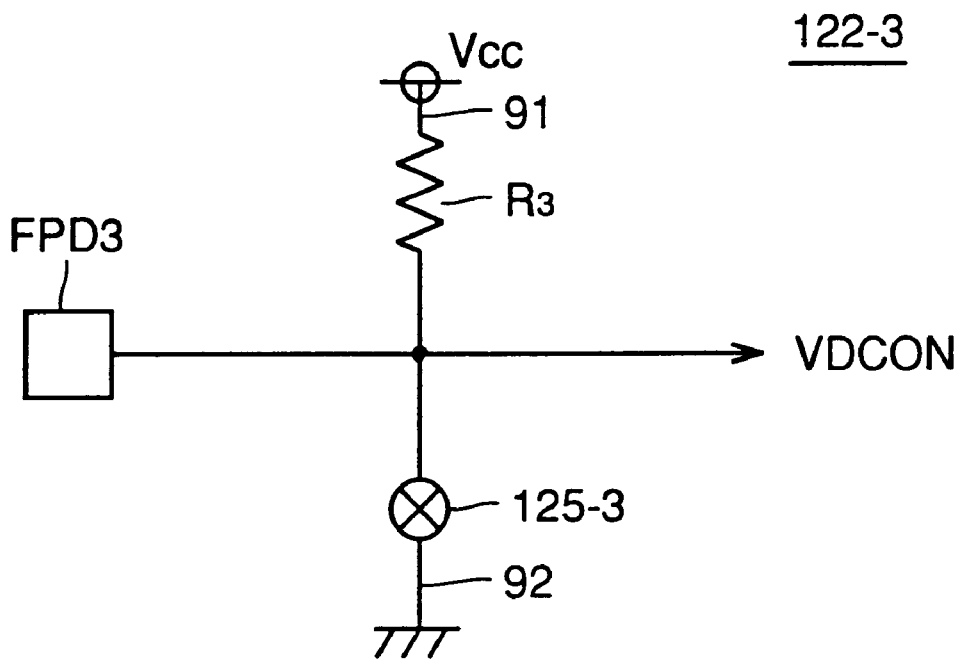
FIG. 10A is a circuit diagram representing a configuration of a fuse circuit 122-3.
Figure 10B:
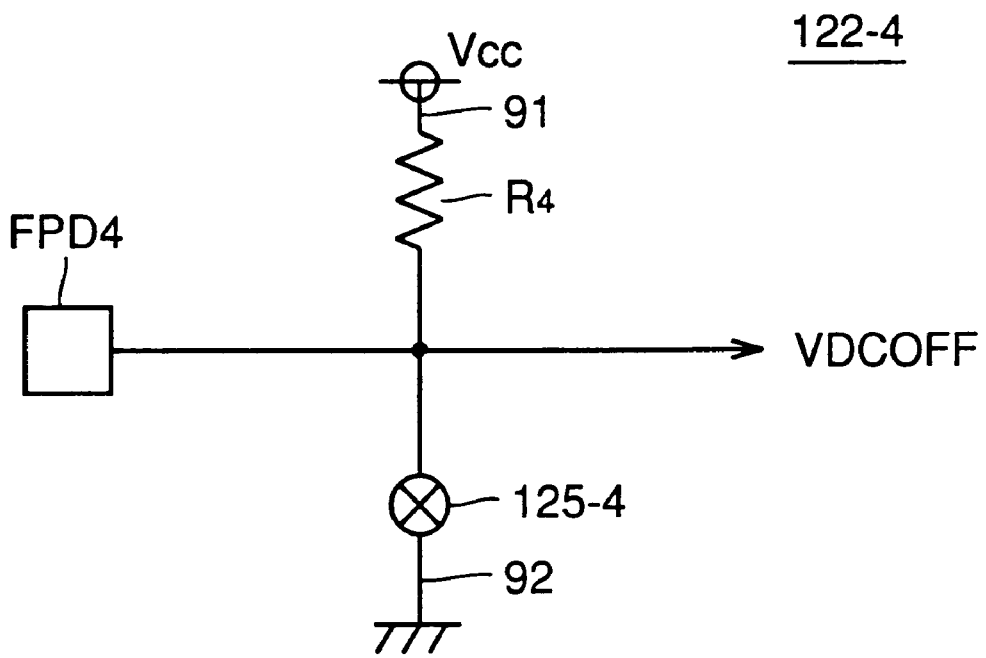
FIG. 10B is a circuit diagram representing a configuration of a fuse circuit 122-4.

FIG. 10A represents a configuration of a fuse circuit 122-3 corresponding to a fuse input pad FPD3, and FIG. 10B represents a configuration of a fuse circuit 122-4 corresponding to a fuse input pad FPD4.

As seen in FIG. 10A, fuse circuit 122-3 outputs mode alteration signal VDCON for altering the operating power supply voltage from +3.3V originally determined by wire bonding to +5V when electric fuse 125-3 is blown. Signal FPM is normally set at the Vss level ("L" level). When a high voltage applied to fuse input pad FPD3 causes electric fuse 125-3 to be blown, signal VDCON attains the Vcc level ("H" level).

Similarly, fuse circuit 122-4 outputs mode alteration signal VDCOFF for altering the operating power supply voltage from +5V originally determined by wire bonding to +3.3V when electric fuse 125-4 is blown. Signal VDCOFF also is normally at the Vss level ("L" level), and attains the Vcc level ("H" level) when electric fuse 125-4 is blown by a high voltage application to fuse input pad FPD4.

Mode alteration signals VDCON and VDCOFF are provided to operating mode inverting circuit 121-2.

Figure 11:
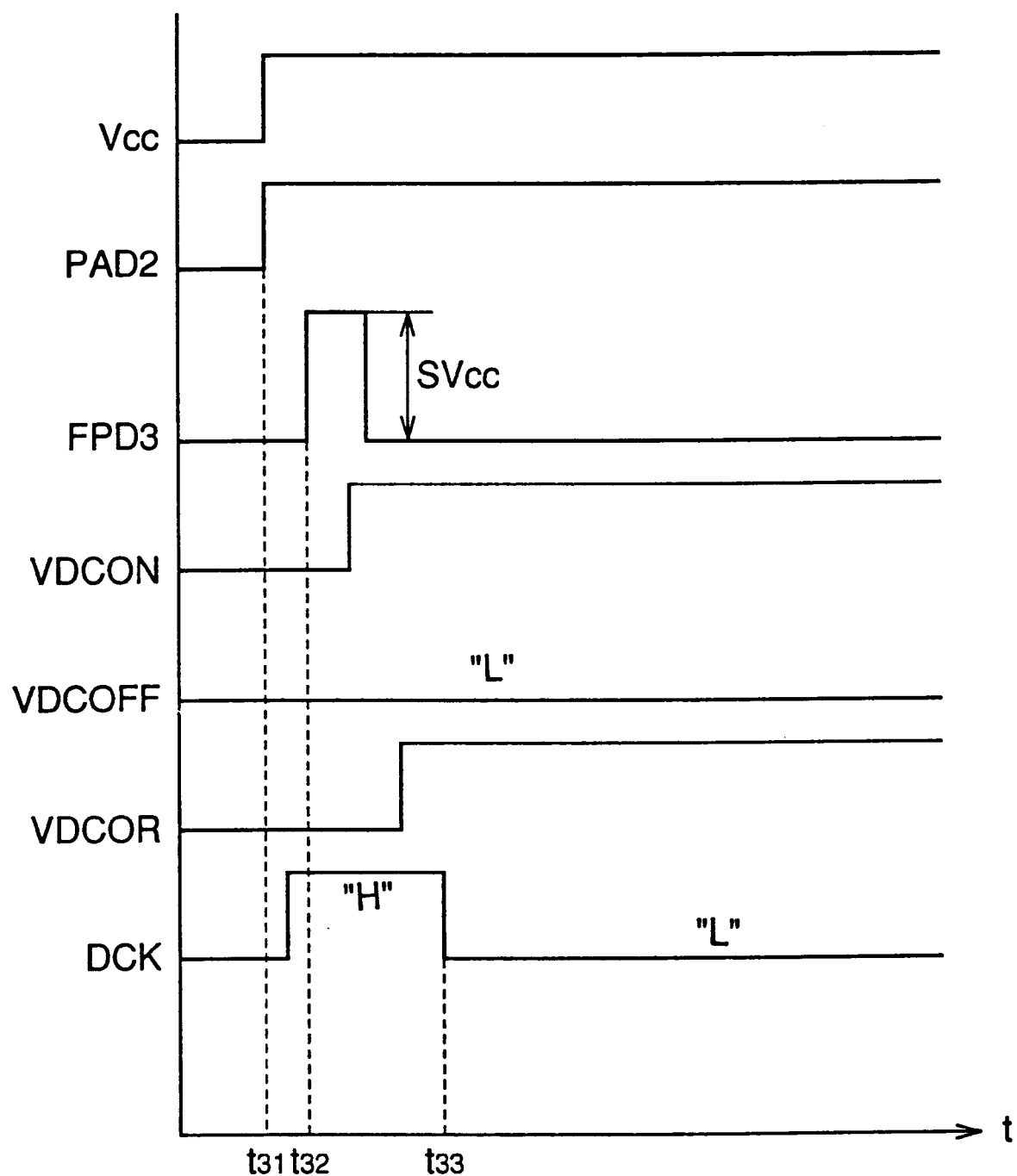
FIG. 11 is a timing chart showing an operating waveform for each portion when the operating power supply voltage setting is altered from 3.3V to 5V in semiconductor integrated circuit device 1100.

Next, the operations of operating mode control circuit 110-2 and operating mode inverting circuit 121-2 will be described with reference to the waveforms of the operating signals for each portion. FIG. 11 is a timing chart related to the operation in which the operating power supply voltage setting is altered from +3.3V to +5V in semiconductor integrated circuit device 1100.

As seen in FIG. 11, at time t31 the operating power supply is turned on and the potential of the Vcc pad rises to the Vcc level. Since the operating power supply voltage is selected to be +3.3V, wire bonding is provided for input pad PAD2, and thus the potential of input pad PAD2 also rises to the Vcc level ("H" level). Signal DCK is fixed at the "L" level before power-on of the operating power supply voltage through an operation similar to the one described above.

At this time, the electric fuse is not yet blown so that both the signals VDCON and VDCOFF are at the "L" level, and signal VDCOR also attains the "L" level. Thus, transistor TP21 is on so that the potential of intermediate node M"

attains the "H" level corresponding to the potential of input pad PAD2, while signal DCK also attains the "H" level, causing the page mode to be set at +3.3V.

Then, at time t32, a potential SVcc sufficient to blow an electric fuse 125-3 is applied in a pulse-wise manner in order to alter the operating mode. Accordingly, electric fuse 125-3 is blown, signal VDCON rises to the "H" level, and signal VDCOR also changes to the "H" level.

With the changes of signals VDCON and VDCOR, transistor TN22 changes from its off state to the on state, while transistor TP21 changes from its on state to the off state. Consequently, the potential of intermediate node M" attains the "L" level, and output signal DCK changes from the "H" level to the "L" level.

As seen from above, by blowing the electric fuse with a high voltage application to the fuse input pad, the operating mode can be altered to +5V even when it was originally set to +3.3V by wire bonding.

Next, the operation will be described below in which the operating power supply voltage, originally set at +5V, is altered to +3.3V after the completion of the manufacturing process.

Figure 12:
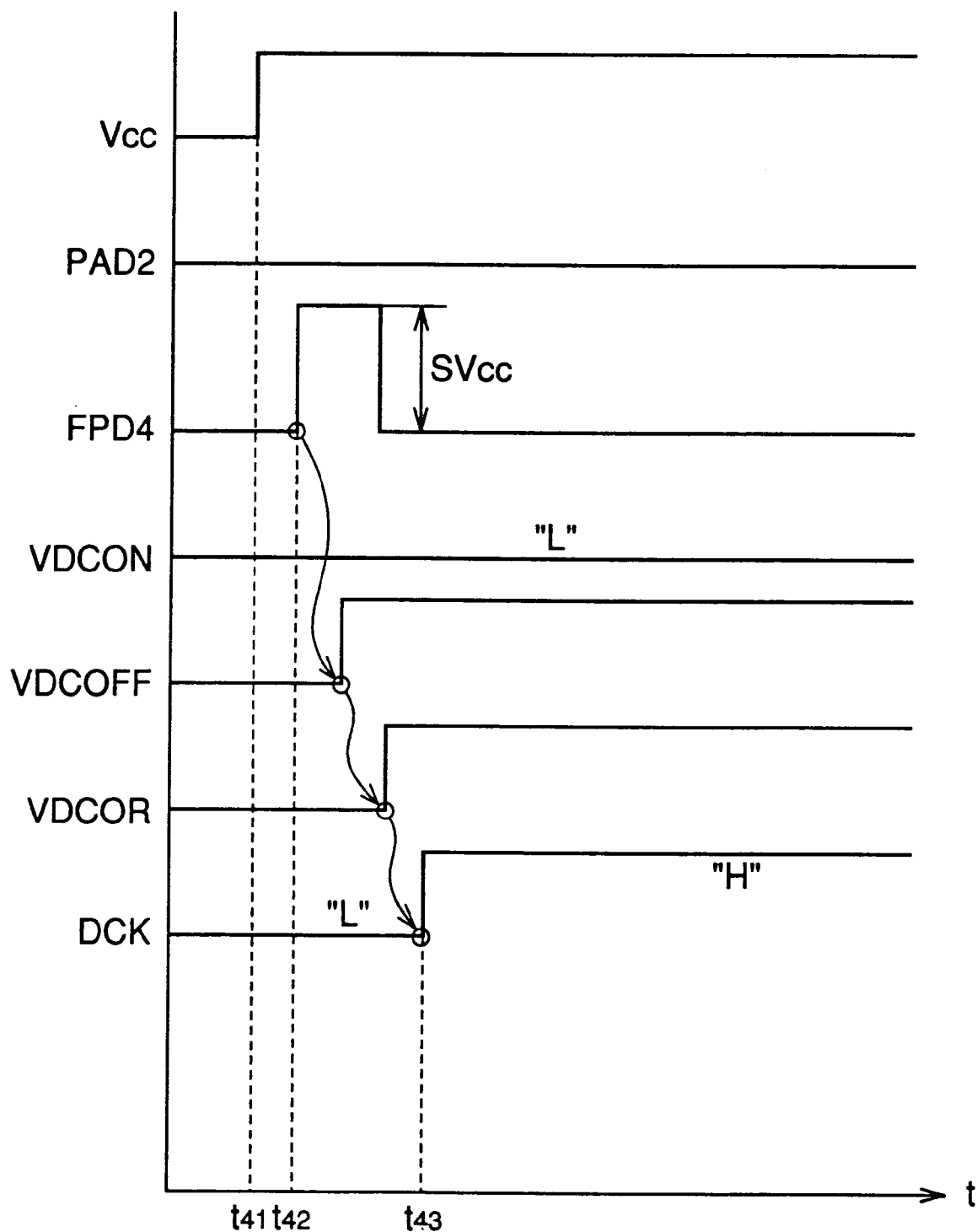
FIG. 12 is a timing chart showing an operating waveform for each portion when the operating power supply voltage is altered from 5V to 3.3V in semiconductor integrated circuit device 1100.

FIG. 12 is a timing chart showing an operating waveform for each portion when the operating power supply voltage is altered from 5V to 3.3V in semiconductor integrated circuit device 1100.

As seen in FIG. 12, first, at time t41, the operating power supply is turned on and the potential of the Vcc pad rises to the Vcc level. Since the electric fuse is not blown at this time, signal VDCOR is at the "L" level and transistor TP21 is on.

The operating power supply voltage is selected to be +5V and input pad PAD2 is in a floating state so that the potential of input pad PAD2 does not rise to the Vcc level ("H" level). Thus, the potential of intermediate node M" connected to input pad PAD2 by transistor TP21 does not attain the "H" level, and the output of inverter IV21 stays at the "H" level so that the on state of the transistor TN25 is maintained. Signal DCK maintains the "L" level as from before the operating power supply is turned on, thereby causing the page mode to be set at +5V.

Then, at time t42, a high pulsed voltage SVcc is applied to fuse input pad FPD4 to blow electric fuse 125-4 in fuse circuit 122-4. When electric fuse 125-4 is blown, signals VDCOFF and VDCOR change to the "H" level.

The turning-off of transistor TP21 and the turning-on of transistor TN23 according to the changes in signals VDCOFF and VDCOR causes the potential of intermediate node M" to attain the "H" level and signal DCK to change from the "L" level to the "H" level. As described above, by blowing the electric fuse with the application of a high voltage to the fuse input pad, the operating power supply voltage, originally set at +5V by wire bonding, can be altered to +3.3V by the subsequent fuse blow.

By utilizing such configurations and operations as described above, in semiconductor integrated circuit device 1000, the operating mode which was once determined by providing wire bonding in the final stage of the manufacturing process for the circuits having the same design can be altered by fuse blow after the completion of the manufacturing process.

Therefore, the operating mode once set can be altered even for a semiconductor integrated circuit device in a final product form by providing an electrical input from outside to the device in its condition of being molded in a package.

Thus, it becomes possible to deal more flexibly with the trend of market demands and the changes in the production plans as well as advantageously to make use of the goods in stock.

Moreover, although the alteration in the selection of the operating mode with regard to the page mode setting and the operating power supply voltage setting is described with reference to the first embodiment, it is understood that the application of the present invention is not limited to the setting of these operating modes. In other words, the mode setting circuit of the present invention can be applied using similar configurations and operations in any operating mode setting in which one of two alternatives is selected.

[Second Embodiment]

In the second embodiment, a configuration of a semiconductor integrated circuit device which is capable of conducting an operational analysis for the various operating modes in a test operation is provided for a semiconductor integrated circuit device allowing such one-of-two-alternatives selection of an operating mode as described in relation to the first embodiment.

Figure 13:
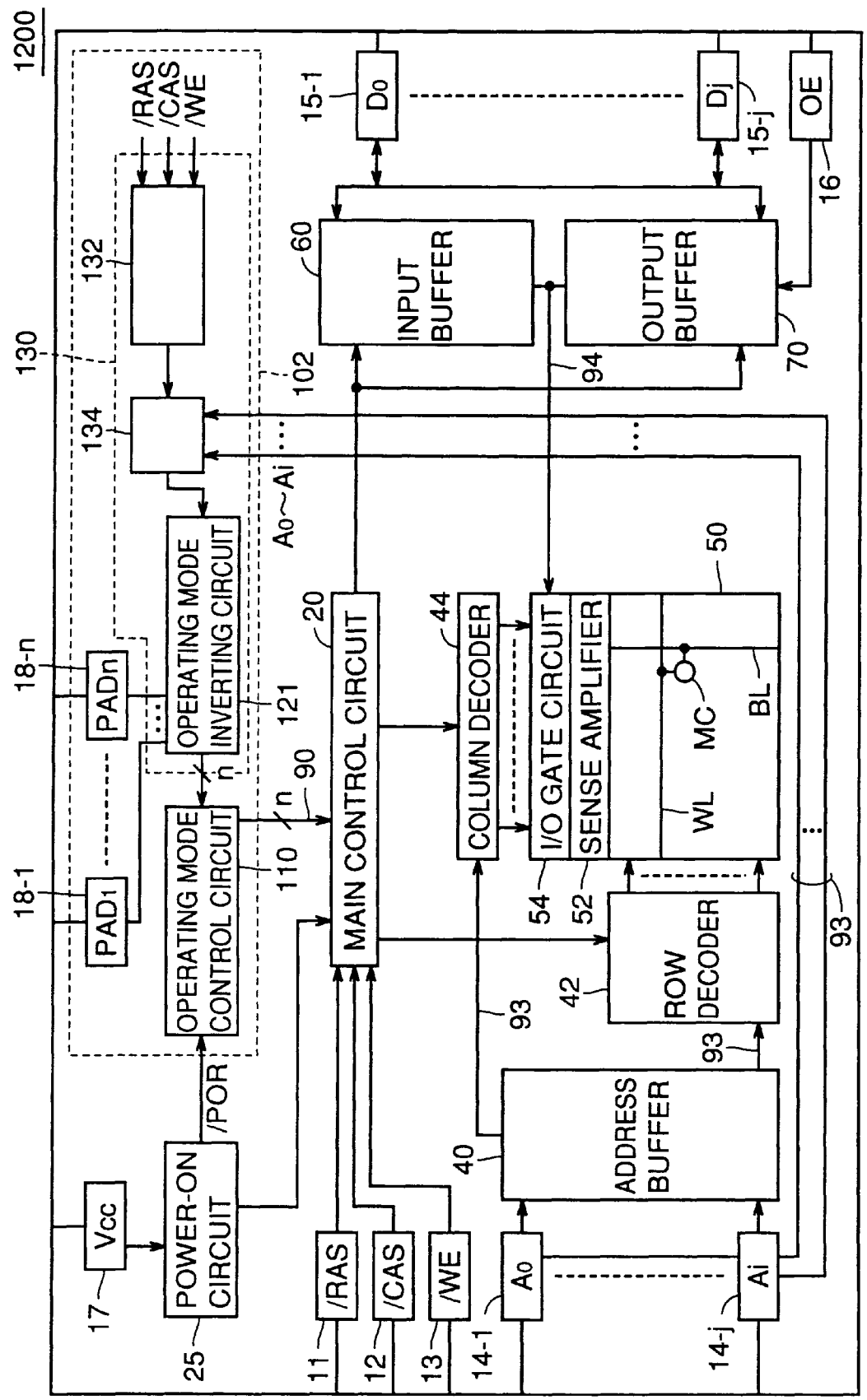
FIG. 13 is a circuit diagram representing an overall configuration of a semiconductor integrated circuit device 1200 according to the second embodiment of the present invention.

FIG. 13 is a schematic block diagram representing an overall configuration of a semiconductor integrated circuit device 1200 according to the second embodiment of the present invention.

As seen in FIG. 13, semiconductor integrated circuit device 1200 of the second embodiment differs from semiconductor integrated circuit device 1100 of the first embodiment in that the former is provided with an operating mode setting circuit 102 instead of operating mode setting circuit 101.

Operating mode setting circuit 102 differs from operating mode setting circuit 101 in that operating mode setting circuit 102 includes a test operation control circuit 130 instead of operating mode alteration circuit 120.

Test operation control circuit 130 includes a test execution signal generating circuit 132, a test mode alteration signal generating circuit 134, and an operating mode inverting circuit 121.

Test execution signal generating circuit 132 instructs the transition to the test operation by activating ("L" level) a test execution signal TST according to a combination of the states of control signals /RAS, /CAS, and /WE.

Test mode alteration signal generating circuit 134 generates test mode alteration signals FPM, EDOM, VDCON, VDCOFF which are similar to mode alteration signals generated by generating mode alteration circuit 120, and the like by the combination of address signals A0-Ai when test execution signal TST is activated ("L" level).

The configurations and the operations of operating mode inverting circuit 121 and operating mode control circuit 110 are similar to those described with respect to FIGS. 6 and 10, and the description will not be repeated here. In comparison, the configuration found in the first embodiment differs from that found in the second embodiment in that, in mode setting circuit 102 in the second embodiment, the mode alteration signal provided to operating mode inverting circuit 121 is generated by test operation control circuit 130 instead of by fuse circuit 122.

Figure 14:
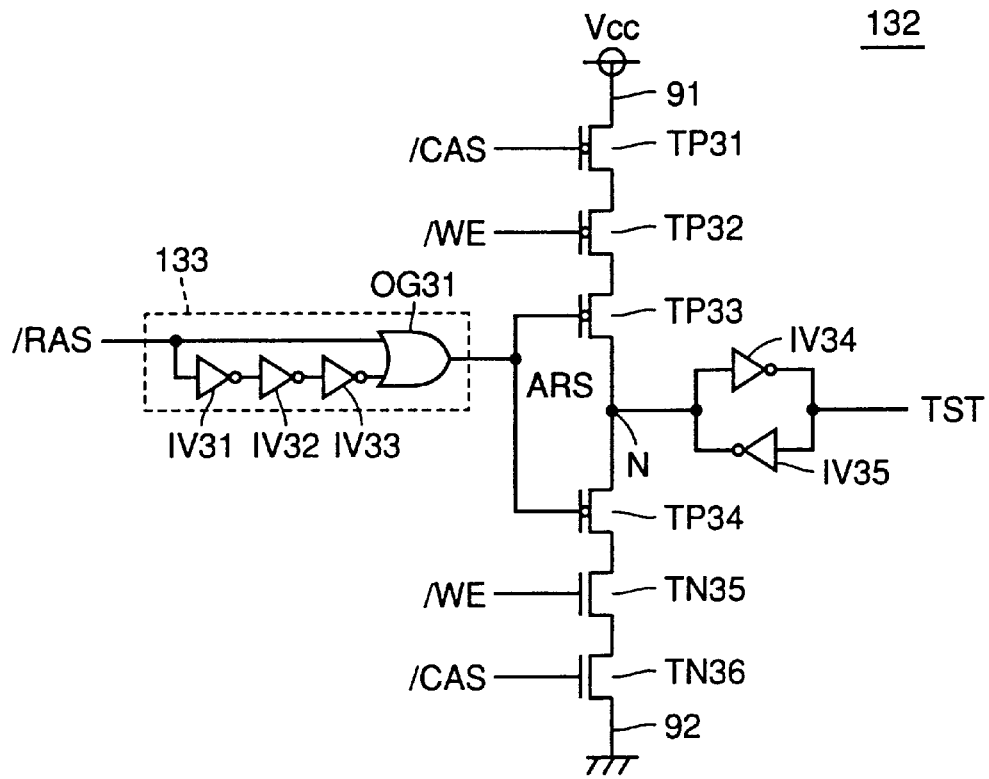
FIG. 14 is a circuit diagram representing a configuration of a test execution signal generating circuit 132.

FIG. 14 is a circuit diagram representing a specific example of a configuration of a test execution signal generating circuit 132.

In FIG. 14, test execution signal generating circuit 132 includes a test trigger generating circuit 133 for generating a one-shot pulse signal ARS activated ("L" level) at the time of the activation (or fall) of signal /RAS, transistors TP31, TP32, and TP33 connected in series between a power supply line 91 and an intermediate node N, and transistors TP34, TN35, and TN36 connected in series between intermediate node N and a ground line 92.

Control signal /CAS is provided to the gates of transistors TP31 and TN36. Similarly, control signal /WE is provided to the gates of transistors TP32 and TN35.

One-shot pulse signal ARS is provided to the gates of transistors TP33 and TP34. Thus, transistors TP33 and TP34 are turned on and kept on for a certain period of time during which signal ARS is activated at the time of the activation of signal /RAS.

Thus, the potential level of intermediate node N is determined by the combination of control signals /CAS and /WE at the time of the activation of control signal /RAS. The state of intermediate node N is latched by inverters IV34 and IV35, and the a signal which is the inverted version of the state of intermediate node N is output as test execution signal TST.

Therefore, in test execution signal generating circuit 132, by first activating ("L" level) control signals /CAS and /WE and thereafter activating /RAS, test execution signal TST can be activated ("L" level), thereby causing the transition to the test operation.

Conversely, RAS-Only-Refresh cycle is provided in order to exit the test operation. Thus, signal /RAS is activated ("L" level) when control signals /CAS and /WE are in the inactive state ("H" level).

Figure 15:
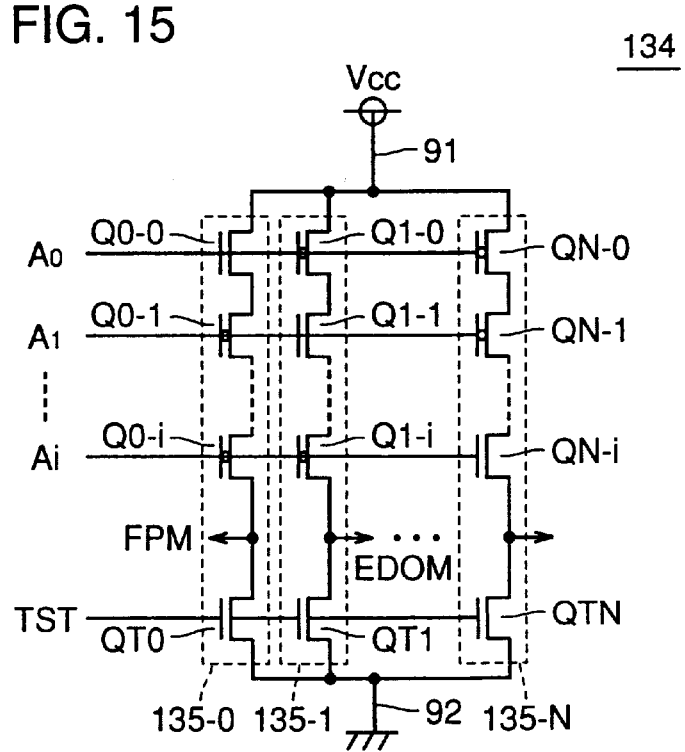
FIG. 15 is a circuit diagram representing a configuration of a test mode alteration signal generating circuit 134.

FIG. 15 is a circuit diagram representing a configuration of a test mode alteration signal generating circuit 134.

In FIG. 15, test mode alteration signal generating circuit 134 includes strings of series-connected transistors 135-0 to 135-N for generating test mode alteration signals.

A series of transistors 135-0 includes transistors Q0-0 to Q0-i and QT0 connected in series with each other between power supply line 91 and ground line 92. Similarly, a series of transistors 135-N includes transistors QN-0 to QN-i and QTN connected in series with each other between power supply line 91 and ground line 92.

In each of the series of transistors, a test mode alteration signal which is corresponding to mode alteration signals at the time of the test operation is obtained at a node connecting transistor QN-i and transistor QTN.

Transistors QT1–QTN included in each series of transistors are turned on when test execution signal TST is inactive ("H" level) to deactivate ("L" level) their respective test mode alteration signals.

In each series of transistors 135-0 to 135-N, a test mode alteration signal which corresponds to an address signal is activated, based on the predefined combinations of each address signal and each mode alteration signal.

For instance, a test mode alteration signal FPM is generated by series of transistors 135-0, and among transistors Q0-0 to Q0-i, only transistor Q0-0 that receives an address signal A0 is formed as an N-channel transistor, while the remaining transistors Q0-1 to Q0-i are formed as P-channel transistors. In such a configuration, test mode alteration signal FPM can be activated ("H" level) by activating address signal A0 alone.

For all series of transistors 135-0 to 135-N, address signal A0 is provided to the gates of transistors Q0-0, Q1-0, to QN-0, and address signal Ai is provided to the gates of transistors Q0-i, Q1-i, . . . to QN-i. Thus, by forming each series of transistors from the combinations of N-channel transistors and P-channel transistors, an appropriate test mode alteration signal corresponding to the address signal can be activated ("H" level) according to the predefined combinations of the test mode alteration signal with the address signal. Therefore, the same condition as that of the blowing of an electric fuse in the first embodiment can be realized in the test operation, allowing testing on the alteration of the operating mode.

The circuits shown in FIGS. 14 and 15 are given by way of illustration only, and do not limit the circuit configurations of test execution signal generating circuit 132 and test mode alteration signal generating circuit 134. Any configuration which allows a test execution signal and a test mode alteration signal to be obtained from a combination of a control signal and an address signal may be employed in place of these illustrated circuits.

Next, the operation of the entire test operation control circuit 130 will be described based on an operational waveform chart.

Figure 16:
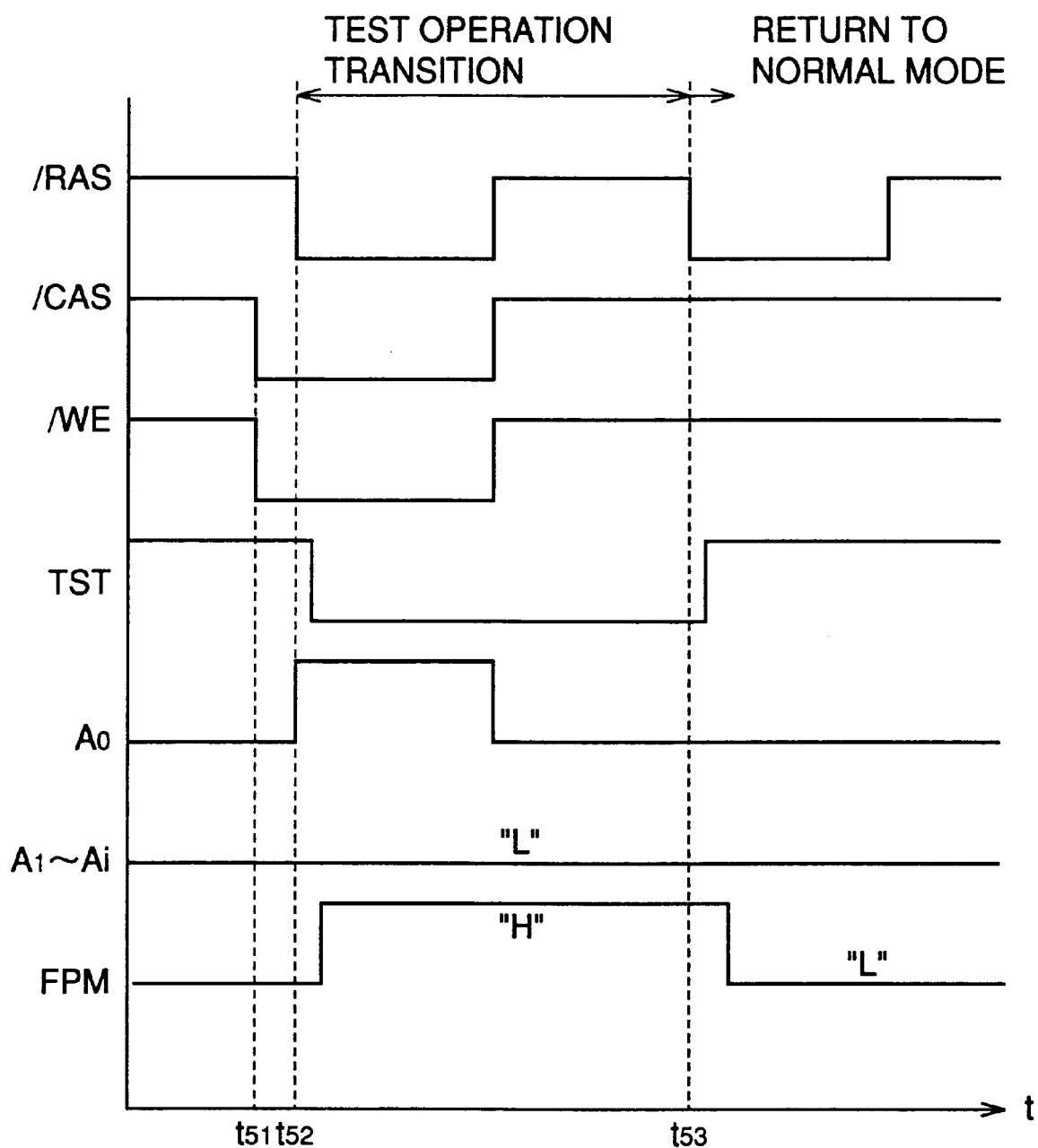
FIG. 16 is a timing chart showing an operational waveform for each portion of a test operation control circuit 130.
Figure 17:
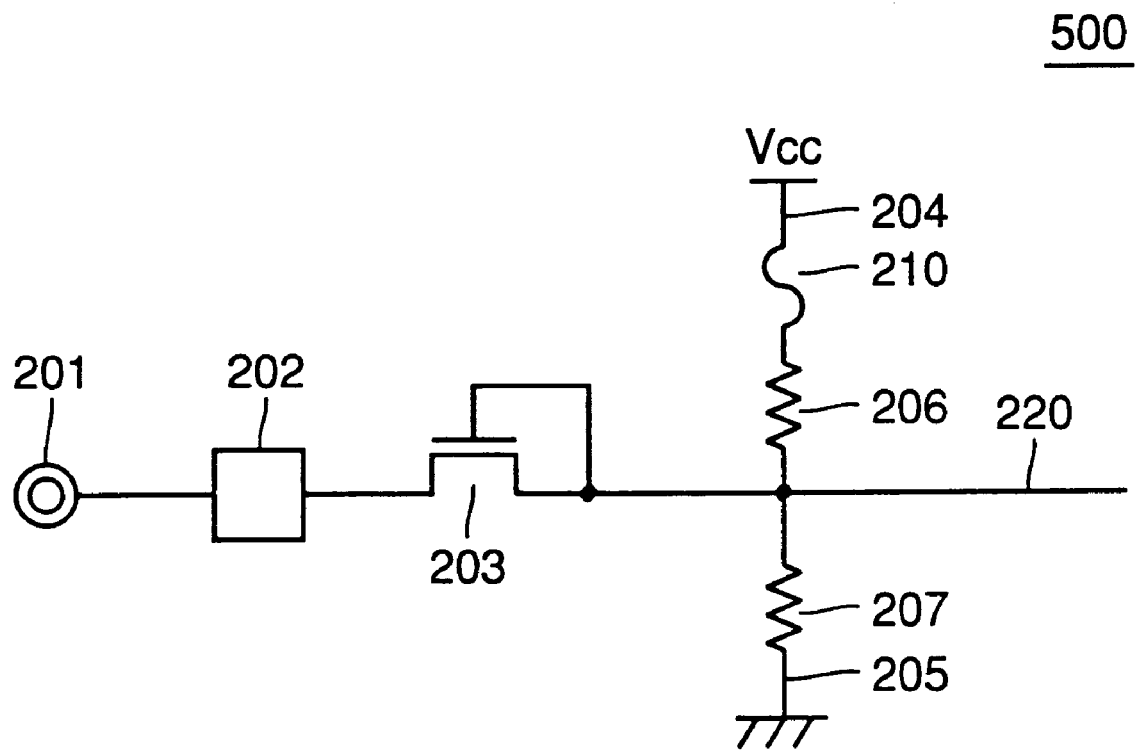
FIG. 17 is a circuit diagram representing a configuration of a prior art mode switching circuit 500.

FIG. 16 is a timing chart showing an operational waveform for each portion of a test operation control circuit 130. The activation of test mode alteration signal FPM for the purpose of testing and analyzing the operation in which the page mode setting is altered from the EDO mode to the FP mode will be described with reference to FIG. 16. As seen from FIG. 15, test mode alteration signal FPM is generated by a series of transistors 135-0 in test execution signal generating circuit 134.

As seen in FIG. 16, at time t51, control signals /CAS and /WE are activated ("L" level) before the activation of control signal /RAS.

Then, at time t52, signal /RAS is also activated ("L" level). Consequently, test execution signal TST is activated ("L" level) by test execution signal generating circuit 132.

Thereafter, address signal A0 is activated to activate test mode alteration signal FPM, and address signals A1–Ai are deactivated.

Accordingly, signal FPM is activated ("H" level) and is provided to operating mode inverting circuit 122. In operating mode control circuit 110, signal MHP described above is set according to the potentials of the external input pad and the test mode alteration signal, and is provided to main control circuit 30. Thus, a desired test mode analysis can be conducted in semiconductor integrated circuit device 1200.

In semiconductor integrated circuit device 1200, any desired test mode alteration signal can be generated by defining in advance the combinations of address signals and test mode alteration signals, and by changing the configurations of series of transistors 125-0 to 125-N according to the combinations. As a result, analyses of various operating modes become possible, in the test operation.

After the test analyses are completed, at time t53, it is possible to return to the normal operation from the test operation by starting the RAS-Only-Refresh cycle, or the condition in which signal /RAS is activated ("L" level) when control signals /CAS and /WE are inactive ("H" level) so that test execution signal TST and the test mode alteration signal are deactivated.

With such a configuration, in a semiconductor integrated circuit device capable of switching the operating mode, various analyses, conducted using a test operation control circuit, of the operation in the altered operating mode prior to the actual alteration become possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   an internal circuit made operative based on either one of two operating conditions according to an operating condition setting signal; and
   an operating condition setting circuit for generating said operating condition setting signal, including
      a first external input terminal,
         an internal control signal generating circuit for generating said operating condition setting signal that selects one of said two operating conditions depending on whether said first external input terminal is coupled to a prescribed potential, and
         an operating condition alteration circuit selectively and in a non-volatile manner allowing an alteration of said operating condition to be set, independent of the potential level of said first external input terminal, by an electrical signal provided externally.

2. The semiconductor integrated circuit device according to claim 1, wherein said operating condition alteration circuit further includes
   a fuse element which can be blown off by a potential of said electric signal applied from outside,
   a second external input terminal to which said electrical signal for blowing said fuse element is applied, and
   a level inverting circuit for inverting a state of said operating condition setting signal generated by said internal control signal generating circuit when said fuse is blown.

3. The semiconductor integrated circuit device according to claim 2, wherein said operating condition setting signal has a first state corresponding to the case where said first external input terminal is coupled to said prescribed potential, and a second state which is an inverted state of said first state, and
   said fuse element includes
      a first setting alteration fuse capable of changing said operating condition setting signal from said first state to said second state when said first external input terminal and said prescribed potential are coupled, and
      a second setting alteration fuse capable of changing said operating condition setting signal from said second state to said first state when said first external input terminal and said prescribed potential are uncoupled.

4. The semiconductor integrated circuit device according to claim 3, wherein said internal control signal generating circuit has an output node for outputting said operating condition setting signal, and said level inverting circuit includes
   a first power supply line for supplying a first potential corresponding to said first state,
   a second power supply line for supplying a second potential corresponding to said second state,
   a first switch circuit for disconnecting said first external input terminal and said output node when either one of said first and second setting alteration fuse is blown,
   a second switch circuit for connecting said output node with said second power supply line when said first setting alteration fuse is blown, and
   a third switch circuit for connecting said output node with said first power supply line when said second setting alteration fuse is blown.

5. The semiconductor integrated circuit device according to claim 1, wherein coupling between said first external input terminal and said prescribed potential is provided by wire bonding.

6. The semiconductor integrated circuit device according to claim 1, wherein said operating condition setting signal has a first state corresponding to the case where said first external input terminal is coupled to said prescribed potential, and a second state which is an inverted state of said first state, and
   said internal control signal generating circuit fixes said operating condition setting signal to said second state before said prescribed potential is supplied.

7. The semiconductor integrated circuit device according to claim 6, further comprising:
   a third power supply line for supplying said prescribed potential; and
   a power-on detection circuit for generating a power-on detection signal activated when said third power supply line is driven; wherein
   said internal control signal generating circuit includes
      an output node for outputting said operating condition setting signal,
      a second power supply line for supplying a second potential corresponding to said second state, and
      a fourth switch circuit for connecting said second power supply line with said output node when said power-on detection signal is inactive.

8. A semiconductor integrated circuit device, comprising:
   an internal circuit made operative based on either one of two operating conditions according to an operating condition setting signal, including
      a memory cell array having a plurality of memory cells arranged in a matrix of rows and columns,
      an address signal terminal for receiving a plurality of address signals for selecting row and column of said memory cells, and
      a control signal terminal for receiving a plurality of control signals for controlling operation of said semiconductor integrated circuit device; and
   an operating condition setting circuit for generating said operating condition setting signal, including
      an external input terminal,
      an internal control signal generating circuit for generating said operating condition setting signal that selects one of said two operating conditions depending on whether said external input terminal is coupled to a prescribed potential, and
      a test operating condition setting circuit selectively allowing an alteration of said operating condition to be set, independent of the potential level of said external input terminal, by a combination of said plurality of control signals and said plurality of address signals provided externally.

9. The semiconductor integrated circuit device according to claim 8, wherein said operating condition setting signal has a first state corresponding to the case where said external input terminal is coupled to said first power supply line, and a second state which is an inverted state of said first state,
   said test operating condition setting circuit includes
      a test execution signal generating circuit for activating a test execution signal for instructing a transition to test operation in response to a combination of states of said plurality of control signals, and
      a test execution signal generating circuit for generating a test mode alteration signal according to a combination of states of said plurality of address signals when said test execution signal is activated, said test mode alteration signal including
- a first test mode alteration sub-signal capable of changing said operating condition setting signal from said first state to said second state when said external input terminal and said first power supply line are connected, and
- a second test mode alteration sub-signal capable of changing said operating condition setting signal from said second state to said first state when said external input terminal and said first power supply line are disconnected, and said test operating condition setting circuit further includes a level inverting circuit for inverting a state of said operating condition setting signal generated by said internal control signal generating circuit when one of said first and second test mode alteration sub-signals is activated.

* * * * *